(12) United States Patent
Paul et al.

(10) Patent No.: US 10,062,788 B2
(45) Date of Patent: Aug. 28, 2018

(54) SEMICONDUCTOR ON INSULATOR DEVICES CONTAINING PERMANENT CHARGE

(75) Inventors: Amit Paul, Sunnyvale, CA (US); Mohamed N. Darwish, Campbell, CA (US)

(73) Assignee: MAXPOWER SEMICONDUCTOR INC., San Jose, CA (US)

( * ) Notice: Subject to any disclaimer, the term of this patent is extended or adjusted under 35 U.S.C. 154(b) by 0 days.

(21) Appl. No.: 12/431,005

(22) Filed: Apr. 28, 2009

(65) Prior Publication Data

US 2010/0025763 A1 Feb. 4, 2010

Related U.S. Application Data

(60) Provisional application No. 61/084,639, filed on Jul. 30, 2008, provisional application No. 61/084,642, filed on Jul. 30, 2008.

(51) Int. Cl.
*H01L 29/78* (2006.01)
*H01L 29/786* (2006.01)
*H01L 29/06* (2006.01)
*H01L 29/40* (2006.01)
(Continued)

(52) U.S. Cl.
CPC .... *H01L 29/78624* (2013.01); *H01L 29/0634* (2013.01); *H01L 29/408* (2013.01); *H01L 29/7824* (2013.01); *H01L 29/7825* (2013.01); *H01L 29/0653* (2013.01); *H01L 29/0696* (2013.01); *H01L 29/0873* (2013.01); *H01L 29/0878* (2013.01); *H01L 29/0886* (2013.01); *H01L 29/42368* (2013.01)

(58) Field of Classification Search
CPC .......... H01L 29/78624; H01L 29/0634; H01L 29/7824; H01L 29/7825; H01L 29/408; H01L 29/42368; H01L 29/0878; H01L 29/0873; H01L 29/0696; H01L 29/0653; H01L 29/0886
USPC ......................................... 257/343
See application file for complete search history.

(56) References Cited

U.S. PATENT DOCUMENTS 3,706,918 A * 12/1972 Barone et al. ............. 257/405
4,746,960 A * 5/1988 Valeri et al. .............. 257/260
5,113,236 A * 5/1992 Arnold et al. ............. 257/347
(Continued)

FOREIGN PATENT DOCUMENTS

JP 1993-102179 * 4/1993 ........... H01L 21/336

OTHER PUBLICATIONS

Napoli, E. Limits and Application of the Newly Proposed Deep-Depletion SOI Mosfets, 2007, IET Circuits Devices Syst., pp. 366-371.*
(Continued)

*Primary Examiner* — David Vu
(74) *Attorney, Agent, or Firm* — Groover & Associates PLLC; Robert O. Groover, III; Gwendolyn G. Corcoran

(57) ABSTRACT

A lateral SOI device may include a semiconductor channel region connected to a drain region by a drift region. An insulation region on the drift layer is positioned between the channel region and the drain region. Permanent charges may be embedded in the insulation region sufficient to cause inversion in the insulation region. The semiconductor layer also overlies a global insulation layer, and permanent charges are preferably embedded in at least selected areas of this insulation layer too.

20 Claims, 12 Drawing Sheets

(51) Int. Cl.
*H01L 29/08* (2006.01)
*H01L 29/423* (2006.01)

(56) References Cited

U.S. PATENT DOCUMENTS

| | | | |
|---|---|---|---|
| 5,282,018 A | | 1/1994 | Hiraki et al. |
| 5,382,818 A | * | 1/1995 | Pein ........................... 257/347 |
| 5,545,909 A | * | 8/1996 | Williams et al. ............ 257/355 |
| 5,559,348 A | * | 9/1996 | Watabe ............... H01L 29/0619 257/141 |
| 5,637,898 A | | 6/1997 | Baliga |
| 5,864,159 A | | 1/1999 | Takahashi |
| 5,912,498 A | * | 6/1999 | Hobson et al. ............... 257/410 |
| 5,973,359 A | | 10/1999 | Kobayashi |
| 5,998,833 A | | 12/1999 | Baliga |
| 6,069,372 A | | 5/2000 | Uenishi |
| 6,114,727 A | | 9/2000 | Ogura et al. |
| 6,191,447 B1 | | 2/2001 | Baliga |
| 6,251,730 B1 | | 6/2001 | Luo |
| 6,388,286 B1 | | 5/2002 | Baliga |
| 6,525,373 B1 | | 2/2003 | Kim |
| 6,541,820 B1 | | 4/2003 | Bol |
| 6,649,975 B2 | | 11/2003 | Baliga |
| 6,686,244 B2 | | 2/2004 | Blanchard |
| 6,710,403 B2 | | 3/2004 | Sapp |
| 6,803,627 B2 | | 10/2004 | Pfirsch |
| 6,835,982 B2 | | 12/2004 | Hogyoku |
| 2001/0041407 A1 | | 11/2001 | Brown |
| 2003/0203576 A1 | | 10/2003 | Kitada et al. |
| 2006/0060916 A1 | | 3/2006 | Girdhar et al. |
| 2008/0157128 A1 | | 7/2008 | Katz et al. |

OTHER PUBLICATIONS

J. T. Watt, B. J. Fishbein & J. D. Plummer; Low-Temperature NMOS Technology with Cesium-Implanted Load Devices; IEEE Trans.Electron Devices, vol. 34, # 1, Jan. 1987; p. 28-38.

J.T.Watt,B.J.Fishbein & J.D.Plummer;Characterization of Surface Mobility in MOS Structures Containing Interfacial Cesium Ions;IEEE Trans.Electron Devices,V36,Jan. 1989; p. 96-100.

J.R.Pfiester, J.R.Alvis & C.D.Gunderson; Gain-Enhanced LDD NMOS Device Using Cesium Implantation; IEEE Trans.Electron Devices, V39, #6, Jun. 1992; p. 1469-1476.

Kimoto, et al, "Impact of Aggressively Shallow Source/Drain Extensions on Device Performance",Jul. 8, 2005,URL /http://jjap.ipap.jp/link?JJAP/44/4843/.

* cited by examiner

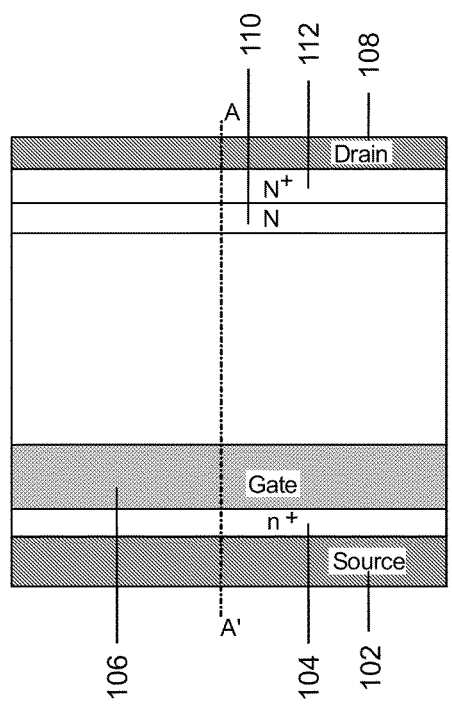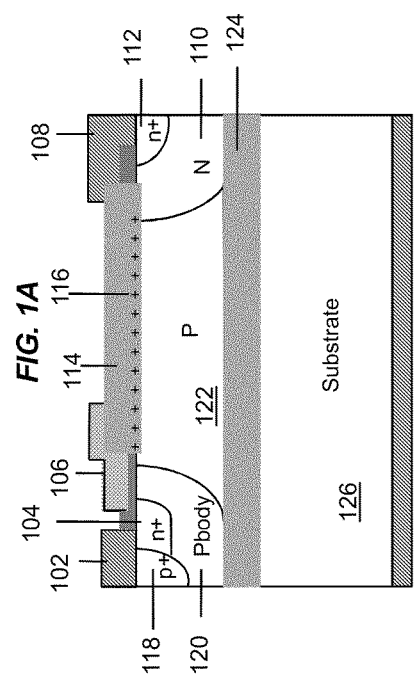
FIG. 1A
FIG. 1B

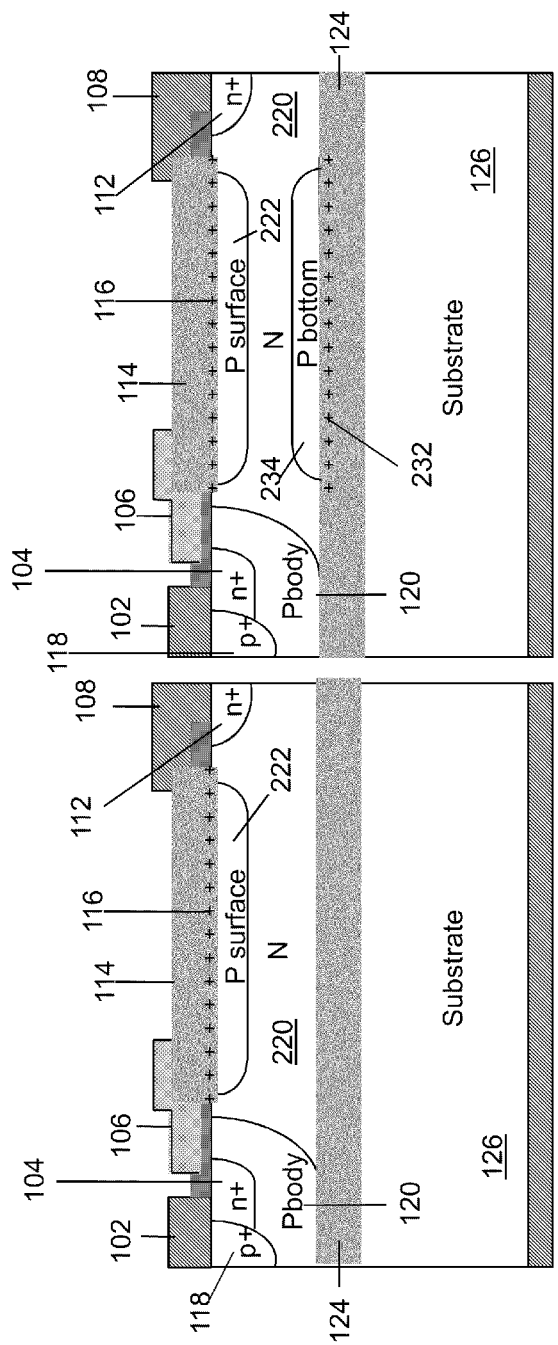

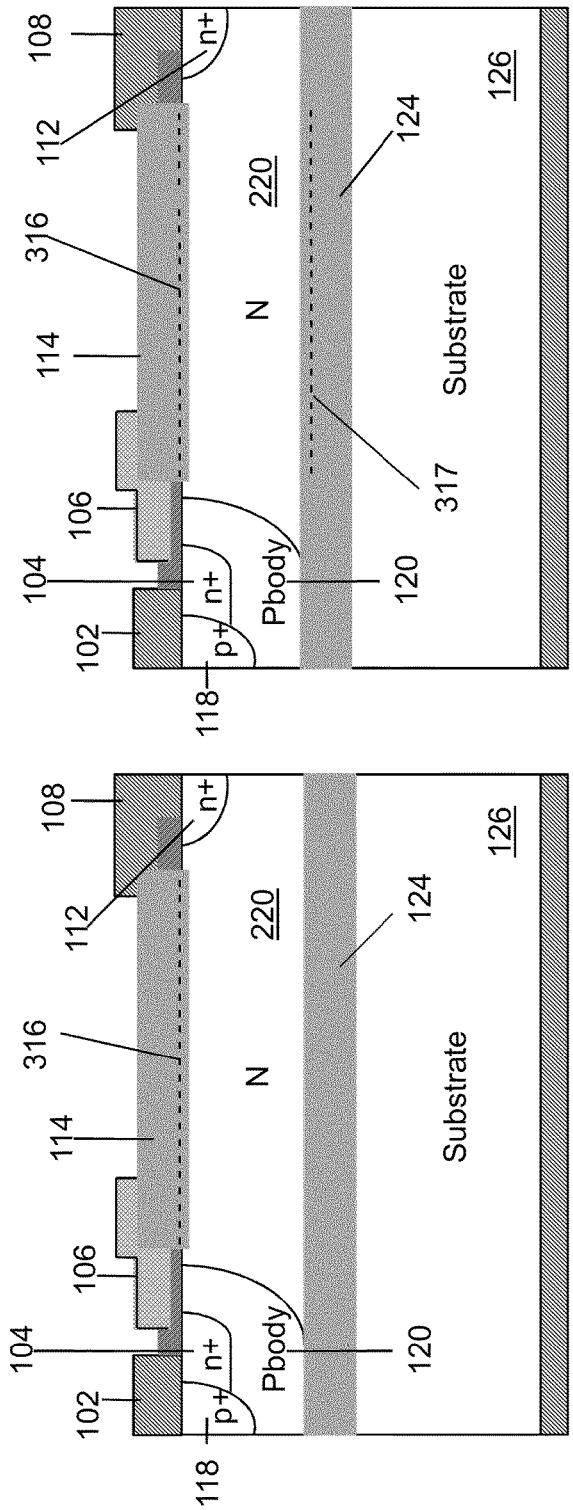

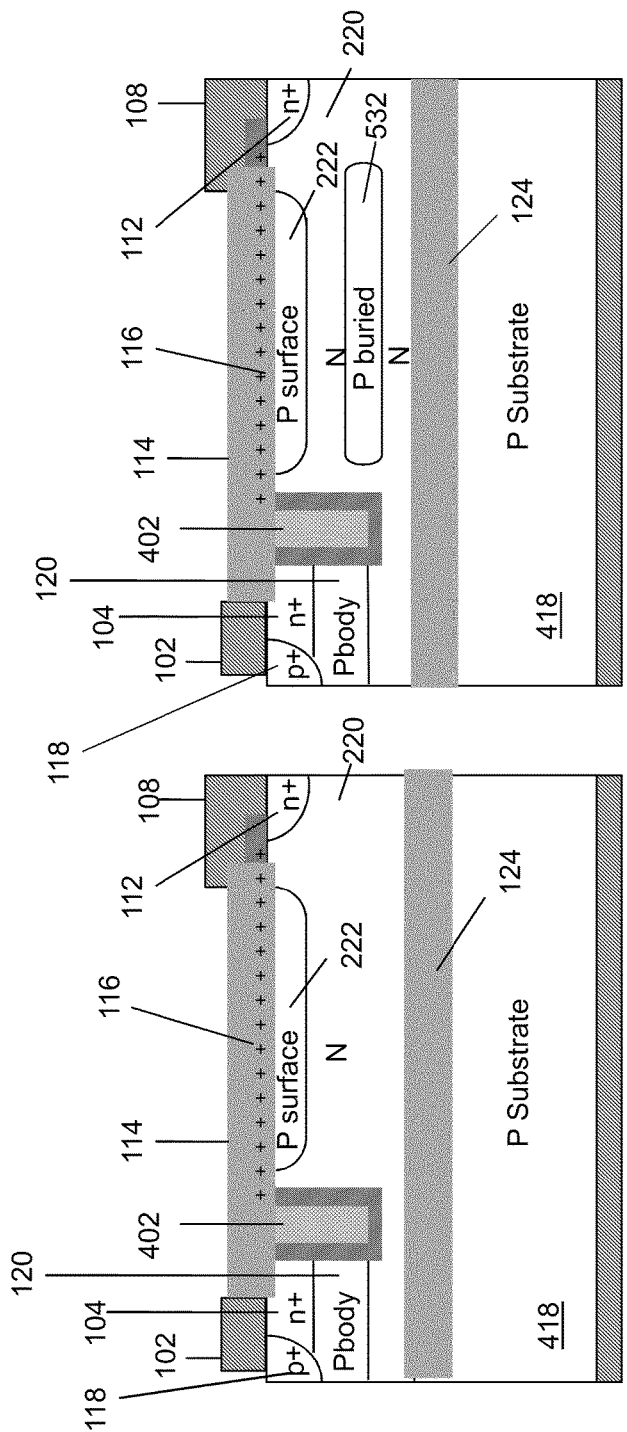

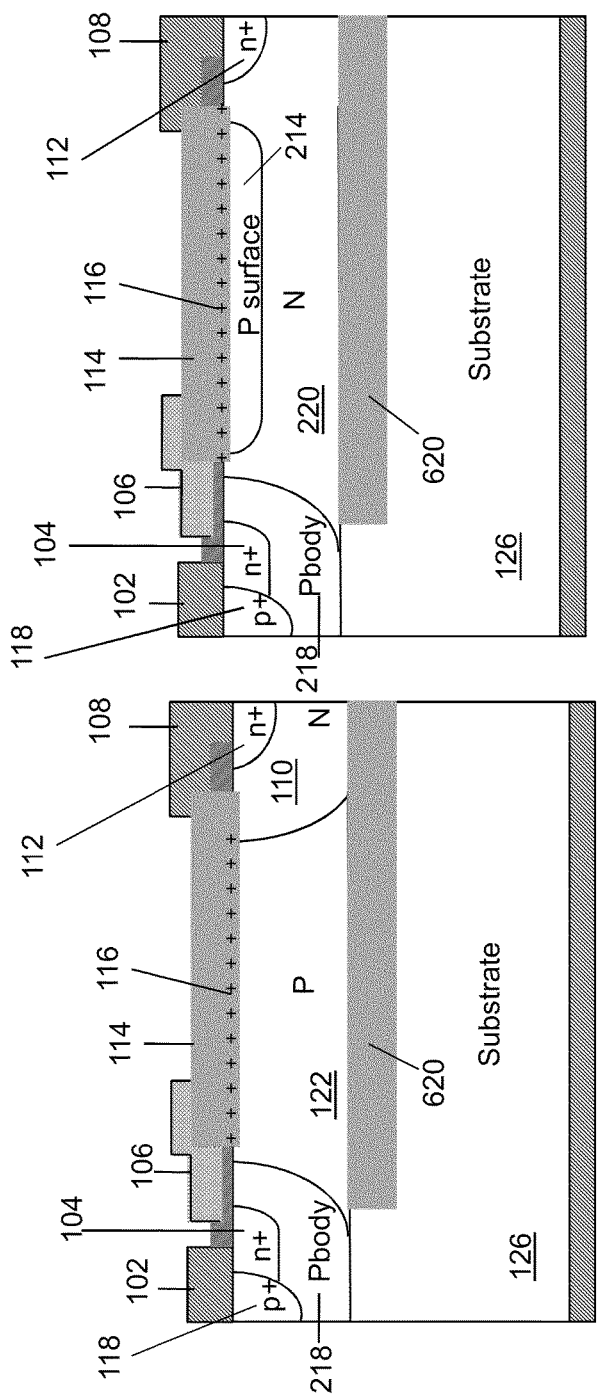

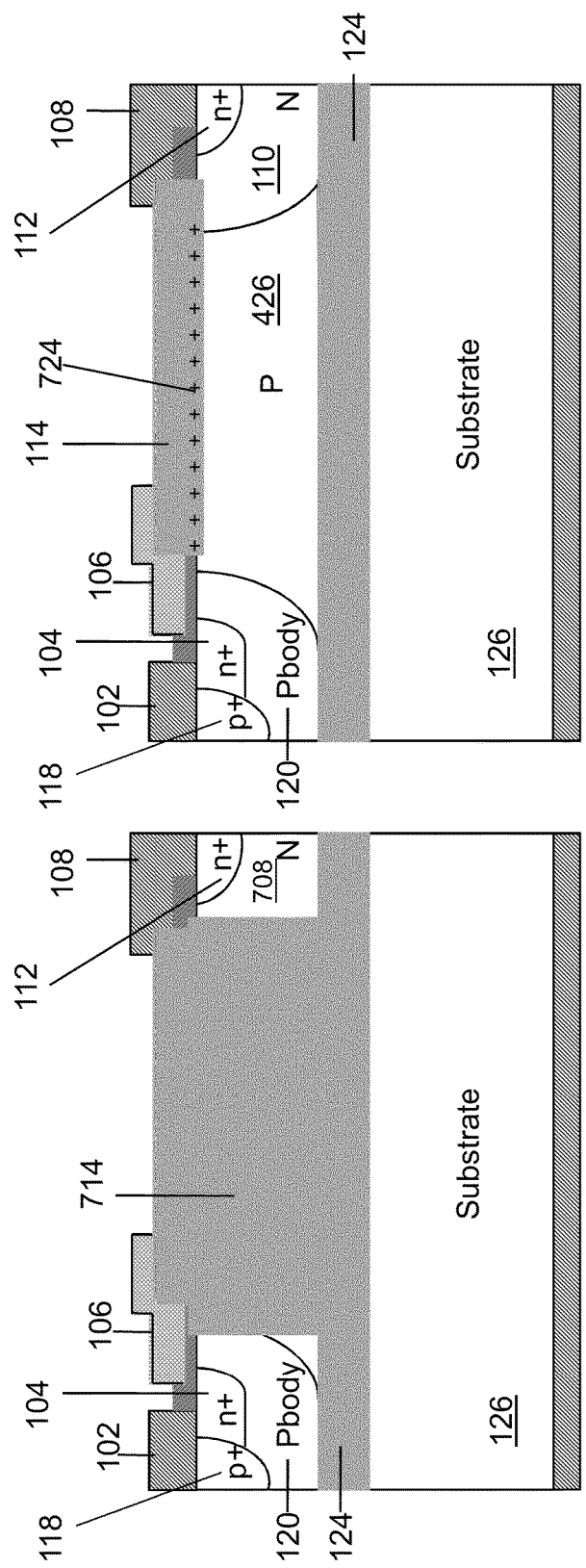

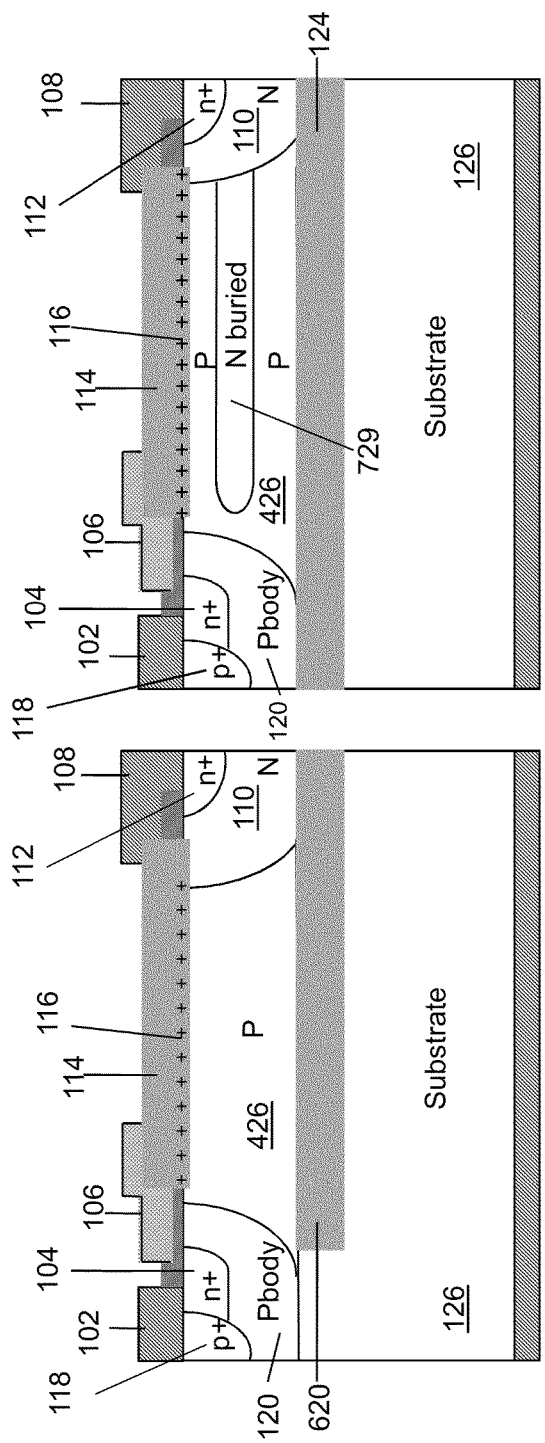

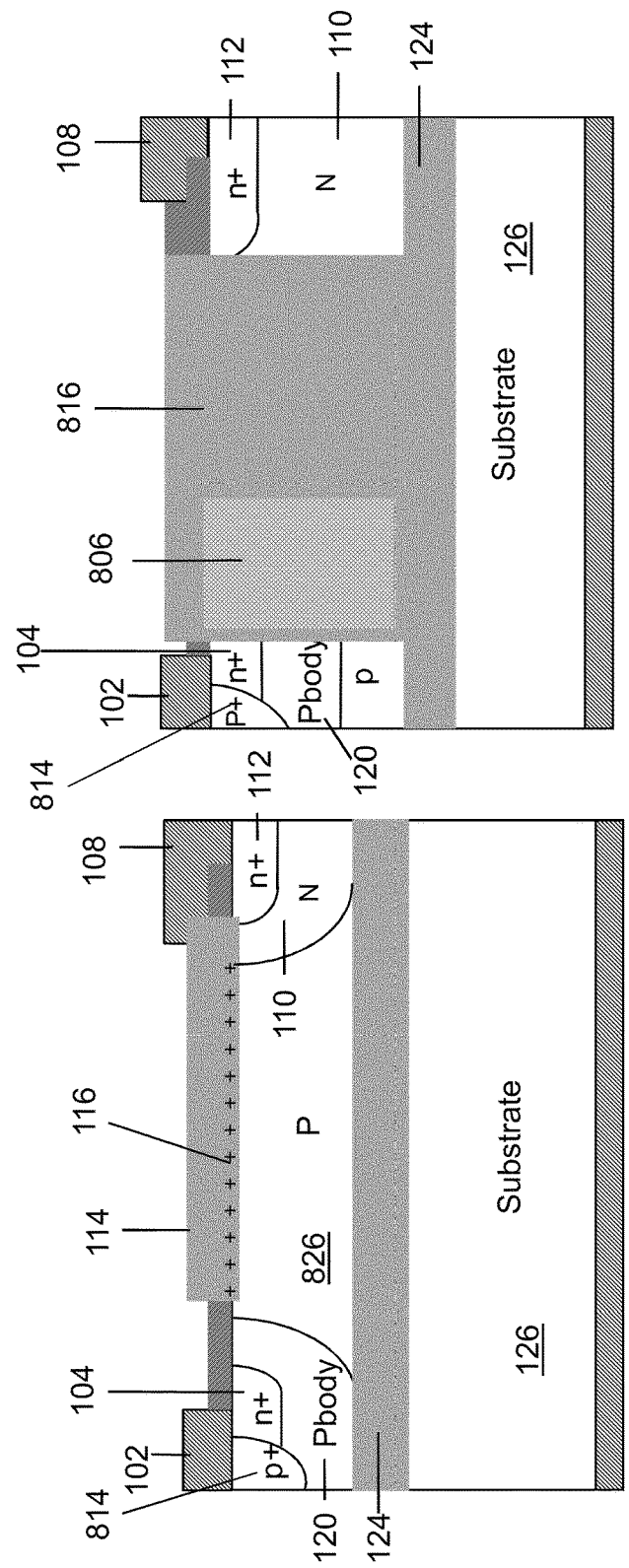

SEMICONDUCTOR ON INSULATOR DEVICES CONTAINING PERMANENT CHARGE

CROSS-REFERENCE TO OTHER APPLICATION

Priority is claimed from provisional application Nos. 61/084,639 and 61/084,642, both filed Jul. 30, 2008, and both hereby incorporated by reference.

BACKGROUND

The present application relates to semiconductor-on-insulator devices, and more particularly to semiconductor-on-insulator devices containing permanent charges.

Note that the points discussed below may reflect the hindsight gained from the disclosed inventions, and are not necessarily admitted to be prior art.

BRIEF DESCRIPTION OF THE DRAWINGS

The disclosed inventions will be described with reference to the accompanying drawings, which show important sample embodiments and which are incorporated in the specification hereof by reference, wherein:

FIG. 1(a) is a structural diagram depicting a top view of a semiconductor-on-insulator device in accordance with an embodiment;

FIG. 1(b) is a structural diagram depicting a side view of a semiconductor-on-insulator device in accordance with an embodiment;

FIG. 2(a) is a structural diagram depicting a semiconductor-on-insulator device in accordance with an embodiment;

FIG. 2(b) is a structural diagram depicting a semiconductor-on-insulator device in accordance with an embodiment;

FIG. 3(a) is a structural diagram depicting a semiconductor-on-insulator device in accordance with an embodiment;

FIG. 3(b) is a structural diagram depicting a semiconductor-on-insulator device in accordance with an embodiment;

FIG. 5(a) is a structural diagram depicting a semiconductor-on-insulator device in accordance with an embodiment;

FIG. 5(b) is a structural diagram depicting a semiconductor-on-insulator device in accordance with an embodiment;

FIG. 6(a) is a structural diagram depicting a semiconductor-on-insulator device in accordance with an embodiment;

FIG. 6(b) is a structural diagram depicting a semiconductor-on-insulator device in accordance with an embodiment;

FIG. 7(c) is a structural diagram depicting a semiconductor-on-insulator device in accordance with an embodiment;

FIG. 7(d) is a structural diagram depicting a semiconductor-on-insulator device in accordance with an embodiment;

FIG. 7(e) is a structural diagram depicting a semiconductor-on-insulator device in accordance with an embodiment;

FIG. 7(f) is a structural diagram depicting a semiconductor-on-insulator device in accordance with an embodiment;

FIG. 8(b) is a structural diagram depicting a semiconductor-on-insulator device in accordance with an embodiment; and FIG. 8(c) is a structural diagram depicting a semiconductor-on-insulator device in accordance with an embodiment.

DETAILED DESCRIPTION OF SAMPLE EMBODIMENTS

Figures 4A, 4B:
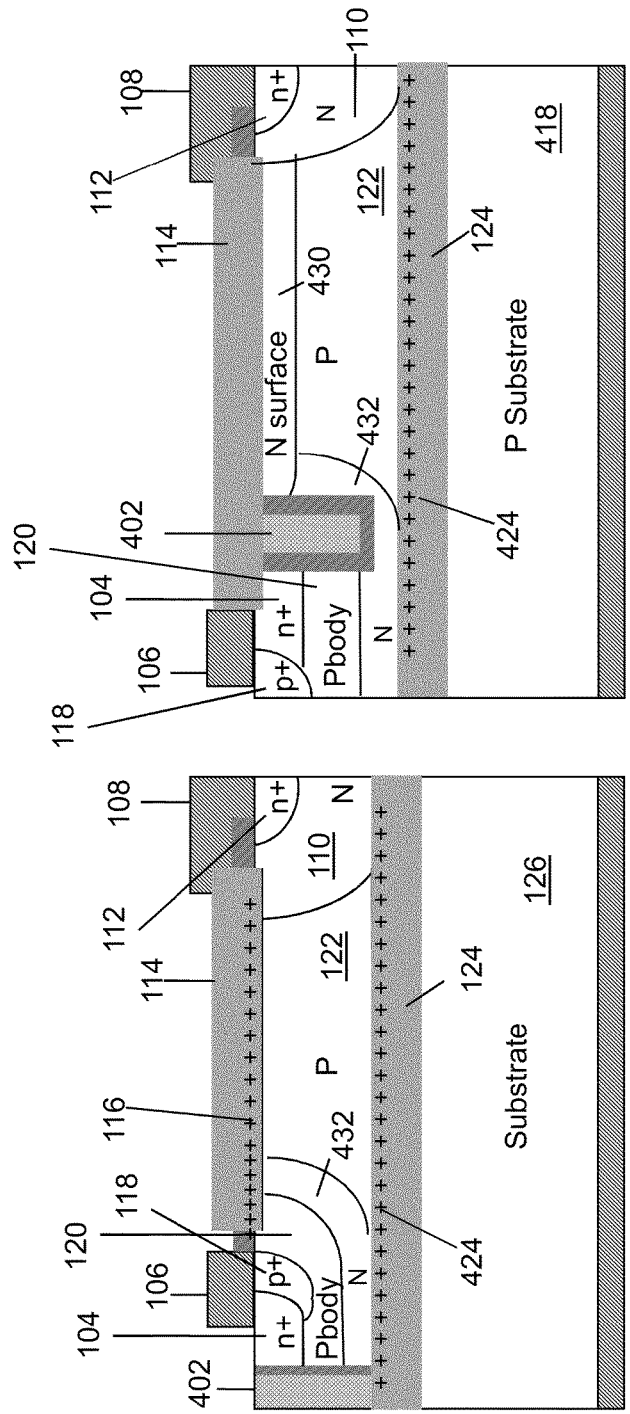
FIG. 4(a) is a structural diagram depicting a semiconductor-on-insulator device in accordance with an embodiment.
FIG. 4(b) is a structural diagram depicting a semiconductor-on-insulator device in accordance with an embodiment.
Figures 6C, 6D:
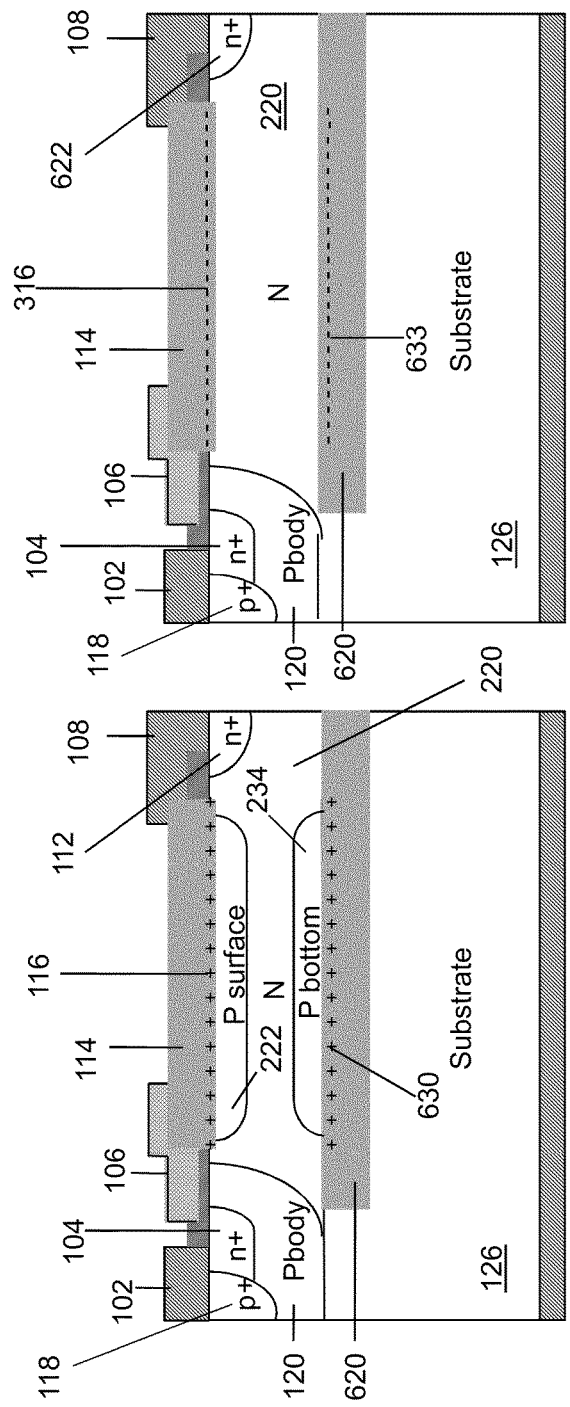
FIG. 6(c) is a structural diagram depicting a semiconductor-on-insulator device in accordance with an embodiment.
FIG. 6(d) is a structural diagram depicting a semiconductor-on-insulator device in accordance with an embodiment.

Power MOSFETs are widely used as switching devices in many electronic applications. In order to minimize both conduction and switching power loss, it is desirable that power MOSFETs for a given breakdown voltage have both a low specific on-resistance and low capacitances. Specific on-resistance ($R_{sp}$) is defined as the product of the on-resistance ($R_{on}$) and the area (A) of a device. Reduced surface field (RESURF) structures such as double RESURF and Double Conduction (DC) structures provide lower $R_{sp}$ than conventional lateral MOSFET structures. However, such structures do not meet the increasing requirement of reduced $R_{sp}$ and capacitances for many new applications.

The use of permanent or fixed charge has been demonstrated to be useful to fabricate devices such as depletion mode vertical DMOS transistors and solar cells. Positive and negative permanent charges can be supplied, for instance, by the implantation of certain atomic species such as Cesium, or the use of dielectric layers such as silicon dioxide in combination with plasma enhanced CVD semiconductor nitride or Aluminum Fluoride ($AlF_3$). These permanent charges can also be used to fabricate high voltage devices where the permanent charge provides the charge balance needed for high breakdown voltage.

The disclosed innovations, in various embodiments, provide one or more of at least the following advantages. However, not all of these advantages result from every one of the innovations disclosed, and this list of advantages does not limit the various claimed inventions:

higher breakdown voltage;
charge balancing;
uniform electric fields.

The present application describes new device structures (and fabrication and operating methods), in which permanent charge is embedded at upper and/or lower interfaces of the drift region in a lateral semiconductor-on-insulator device.

The numerous innovative teachings of the present application will be described with particular reference to presently preferred embodiments (by way of example, and not of limitation).

This application discloses a number of lateral structures built in semiconductor-on-insulator (SOI) substrates making use of permanent charge to provide charge balance. Under reverse-bias, electric field lines emanating from ionized doping atoms in the depletion region are terminated by the permanent charge, resulting in more uniform electric field and higher breakdown voltage compared to conventional devices. The devices in the following embodiments are MOSFETs but the disclosed inventions are applicable to other devices such as diodes, JFETs, IGBTs, thyristors and other devices that can block voltages.

Additional detail concerning implementation of a lateral device with permanent charge for charge termination over the drift region is found in copending application Ser. No. 12/432,917, which is hereby incorporated by reference in its entirety.

FIG. 1A shows a top view of one example of a Lateral MOSFET structure 100, and FIG. 1B shows a cross-sectional view of the same device, taken along line AA' as shown in FIG. 1A. In this example, the n-channel lateral semiconductor-on-insulator (SOI) device 100 includes an n+ source 104, a p-type body region 120 which separates the source 104 from a drift region 122, an n-type deep drain 110, and an n+ shallow drain diffusion 112. The drift region 122 is relatively lightly doped, and in this example is p-type.

Contact 102 makes contact to the body (through p+ body contact diffusion 118) and source regions, while contact 108 makes ohmic contact to the drain. Conductive gate electrode 106 is capacitively coupled to a surface portion of the body 120, to invert it (and thereby allow conduction) when the voltage on 106 is sufficiently positive. (This portion of the body is therefore referred to as a "channel," but is not separately indicated in this figure.) A dielectric 114 overlies the drift region 122.

Note that permanent charge 116 is embedded at the interface between dielectric 114 and semiconductor 122; in this example this charge is positive, but as discussed below various alternatives are possible. In this example the charge is provided by ions in the dielectric, but here too alternatives are possible.

This structure is fabricated on a semiconductor die which includes a substrate 126. An insulation layer 124 overlies the substrate 126, and provides complete isolation of the active devices from the substrate 126. (For this reason the substrate 126 may be referred to simply as a "handle wafer.") The insulation layer 124 is typically silicon dioxide, although it will be recognized by those having skill in the art that other materials can be used where appropriate.

There are several ways to achieve semiconductor-on-insulator (SOI) structures, and typically the SOI wafers will be bought from a specialty vendor rather than made in-house. The SOI wafers may be fabricated by deep implantation, by wafer bonding and etchback, or even by vacuum deposition of a semiconductor material over a seed layer or directly onto the dielectric.

Deep n-type drain region 110 and a shallower n+ region 112 are located near the drain electrode 108. A p-type body region 120 extends below the gate region 106 with the source region 104 and body 120 regions being contacted adjacent to the gate region 106. The gate electrode 106 sits atop an insulating layer 114, which is referred to as the gate oxide, although, again, the material may not actually be an oxide. Permanent charge 116 of a positive polarity exists in the insulating region 114, at the surface of the device. This permanent charge 116 is preferably located near the insulator-to-semiconductor interface for maximum effectiveness. The permanent charge 116 enables the MOSFET 100 to function normally, as an inversion charge is induced at the surface between the drain region 110 and the gate region 106. The gate electrode 106 controls the current flow between the drain region 110 and the source region 104.

In this embodiment, the permanent charge 116 enables continuity of electron flow from source-to-drain, in the on-state. In the off-state (i.e., under reverse bias), the permanent charge 116 terminates electric field lines emanating from the depletion layer, thereby reducing the electric field seen between the drain region 110 and the source region 104. That is, when the semiconductor material is depleted, each ionized dopant atom provides a point charge. Since the overall device does not have any significant net charge, each point charge in the device will have a counterpart of opposite sign. If the charges in the depletion region are balanced by charge on the source or drain, then an additional electric field component will be added which is generally aligned with the axis between source and drain. Since this is the direction of primary voltage gradient anyway, this conventional arrangement adds to the peak electric field.

Instead, the present inventors have realized that charge balancing can be achieved otherwise in a lateral device. By providing a distributed complementary permanent charge 116, the ionized dopant atoms in the depleted drift region do not contribute to electric field along the source-drain axis. This reduced electric field increases the breakdown voltage that is achievable.

Another class of embodiments is shown in FIG. 2A. In this embodiment the semiconductor-on-insulator layer 220 is n-type, and a shallow p-type surface 222 overlies the drift region. The permanent charges 116 serve to deplete, and preferably invert the p-type diffusion 222. Other elements are generally the same, as indicated by corresponding reference numerals.

Another class of embodiments is shown in FIG. 2B. In this Figure an additional p-type diffusion 234 is formed at the back interface of the drift layer, where it overlies the insulator with permanent positive charge 232 at the insulator interface 124. (This can be implemented, for example, by implanting acceptors into layer 220 at an intermediate stage of growth.) Positive charge 232 provides additional termination for ionized dopants in the depleted drift region. Also, an additional current path is preferably provided due to the inversion of bottom p-type layer 234, which further reduces $R_{sp}$.

FIG. 3A shows a power MOSFET 300 having a semiconductor-on-insulator layer 220 which is n-type, but which does not include the diffusion 222 shown in FIG. 2A. In this case the permanent charge is preferably a negative charge 316, which balances ionized donor atoms in the depleted drift zone under reverse-bias conditions.

FIG. 3B shows another class of embodiments, in which a structure (301) like that of FIG. 3A is further modified with negative permanent charge 317 at the back interface. This configuration increases the breakdown voltage achievable and allows increasing the n-layer doping which reduces $R_{sp}$.

FIG. 4A shows another class of embodiments, which includes positive permanent charge both at the front interface (charge 116) and at the back interface (charge 424). This permanent charge further helps to compensate the charge of ionized acceptor dopants in the depleted drift region. Moreover, this embodiment uses a trench gate 402, and the source 104 and body-contact diffusions 120 have been relocated accordingly. Note that the combination of a trench gate with the permanent charge at the back interface is believed to be especially advantageous, since (in the ON state) the trench gate tends to launch majority carriers below the depth of the body diffusion. Current can flow in both the bottom and top inversion layers produced by the two levels of permanent charge.

FIG. 4B shows another trench gate embodiment. In this embodiment the gate trench is interposed between the channel region and the p-type volume of the epitaxial layer. Note, however, that an n-surface layer 430 provides a current path from the n-type near drift region 432 to the drain 110, and another path is provided by the inverted portion of the p-type material in proximity to the permanent charge 424. Note also that, in this embodiment, the permanent charge 424 extends beneath the trench gate 402. Since the permanent charge 424 is positive in this example, it will produce some local conductivity enhancement in the n-type region 432 where it reaches the back interface, i.e. at the interface to dielectric 124.

FIG. 5A shows another class of embodiments, in which a trench gate 402 controls conduction in a channel which is on the opposite face of the trench gate from the drift region 220. As in the embodiments of FIG. 2A, fixed positive charge 116 at least depletes (and preferably inverts) a shallow p-type diffusion 222. P-type region 222 can be electrically floating, or can be connected to the body region 120 at selected locations.

FIG. 5B shows another embodiment, which differs from FIG. 5A in that a p-type buried layer 532 has been added. Again, this allows an increase in drift region doping (and hence on-state conductivity) for a given breakdown voltage. The buried layer 532 may also help to allow use of a thicker drift layer, and hence further improvement in on-state conductivity. The p-buried layer 532 can be electrically floating, or can be connected to the p-body 120 in certain regions of the device, as can p-type region 222. As in FIG. 5A, permanent charge 116 preferably inverts the surface of the p-type region 528, also reducing the $R_{sp}$.

FIGS. 6A through 6D show other alternative embodiments, in which a partial buried dielectric layer 620 is used instead of the buried layer 124. This provides improved heat conduction to the backside of the device, where bonding to a heat sink typically occurs.

Figures 7A, 7B:
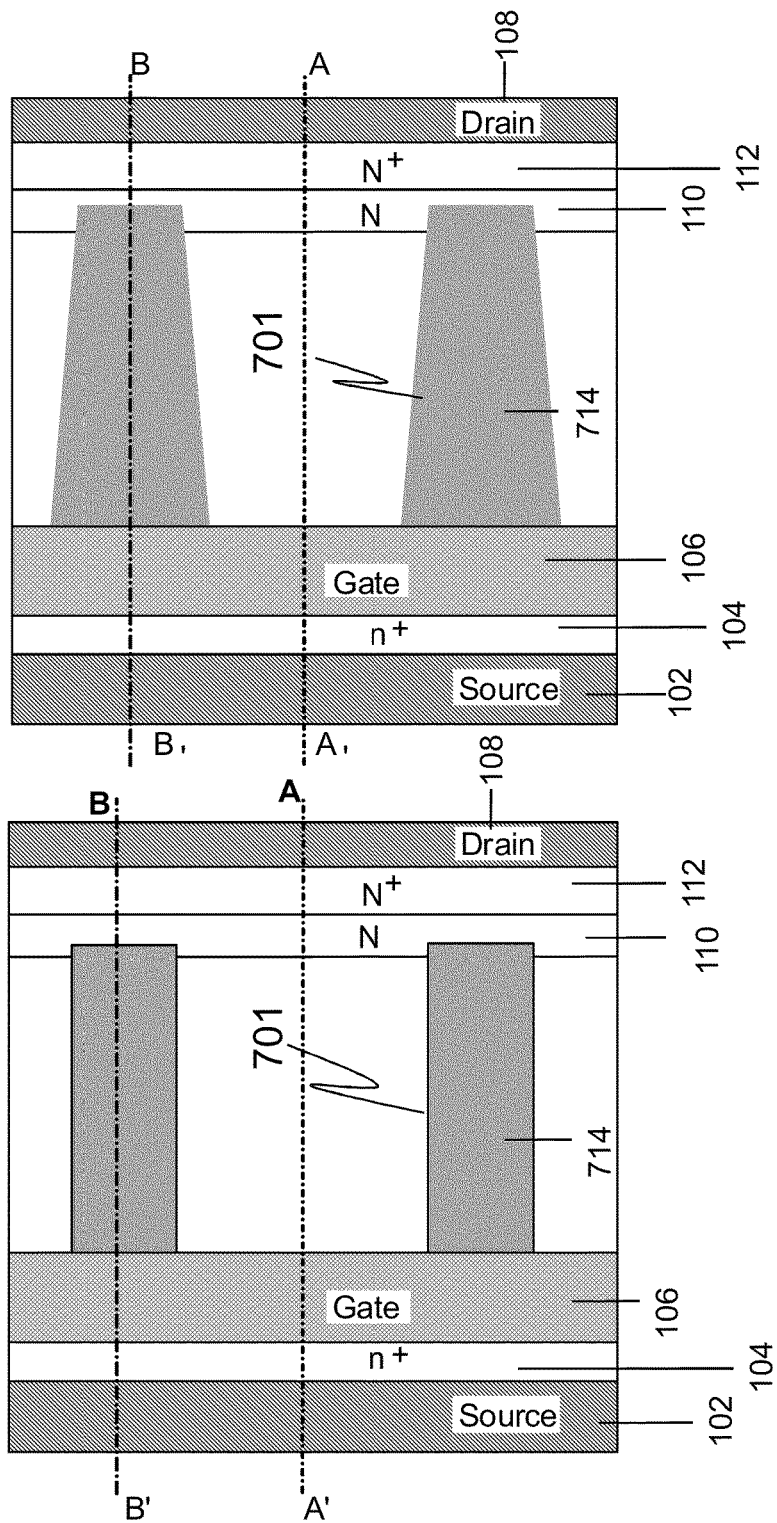
FIG. 7(a) is a structural diagram depicting a semiconductor-on-insulator device in accordance with an embodiment.
FIG. 7(b) is a structural diagram depicting a semiconductor-on-insulator device in accordance with an embodiment.

FIG. 7A is a top view of an alternative class of embodiments, which can be used instead of the geometry of FIG. 1A for the various embodiments described above. In this embodiment the drift regions are laterally bounded by dielectric filled trenches 714 which extend from under the gate region 106 to the deep drain region 110. Further charge balancing is preferably achieved, with geometries of this type, by including permanent charge 701 at the interfaces between the insulator filled trenches 714 and the drift regions of the active device. This permanent charge 701 is preferably located near the insulator-to-semiconductor interface along the sides or sides and bottom trench surfaces, for maximum effectiveness. This sidewall permanent charge can be used in combination with the many possible configurations of permanent charge, diffusions, buried oxide, and source structure described above.

FIG. 7B shows an alternative class of embodiments, in which the lateral isolation trenches 714 are tapered. Again, permanent charge 701 is preferably located on at least some of the sidewall area of this isolation trench.

FIG. 7C shows a section along line B-B' through a sample implementation of FIG. 7A, and FIG. 7D shows section A-A' in the same device. In this example, the trench dielectric 714 is shown as coming down to meet the buried dielectric 124, though this is not strictly necessary. Note also that the gate region 106 overlaps the insulator filled trench 714 ensuring continuity of electron flow. Furthermore, permanent charge may or may not be present in the top oxide 714 or buried oxide 124.

FIG. 7D shows a cross-sectional view taken along line AA' of FIG. 7A or FIG. 7B. In the on-state, the gate electrode 106 controls the current flow between the drain region 112 and the source region 104. The permanent charge 724 enables the MOSFET to function normally, despite having a P-type region 426 separating the channel from the drain. An inversion charge is induced between the drain region 108 and the gate region 106, both at the surface (due to positive permanent charge 724) and along the trench walls (due to positive permanent charge 701). These inversion layers allow continuity of electron flow. The additional current paths along trench walls results in reduction in $R_{sp}$. In the off-state, the permanent charge 724 terminates electrical field lines emanating from the depletion layer thereby reducing the electric field seen between drain and source. This behavior increases the breakdown voltage achievable.

FIG. 7E shows another alternative embodiment, which differs from that of FIG. 7D in that a partial buried dielectric 620 is used in place of the buried layer 124. This improves thermal conduction.

FIG. 7F shows another modification of the embodiment of FIG. 7D. In this case an additional n-buried layer 729 has been added into the p-type layer 426; this layer 729 provides an additional current path between source and drain, and therefore reduces $R_{sp}$.

Figure 8A:
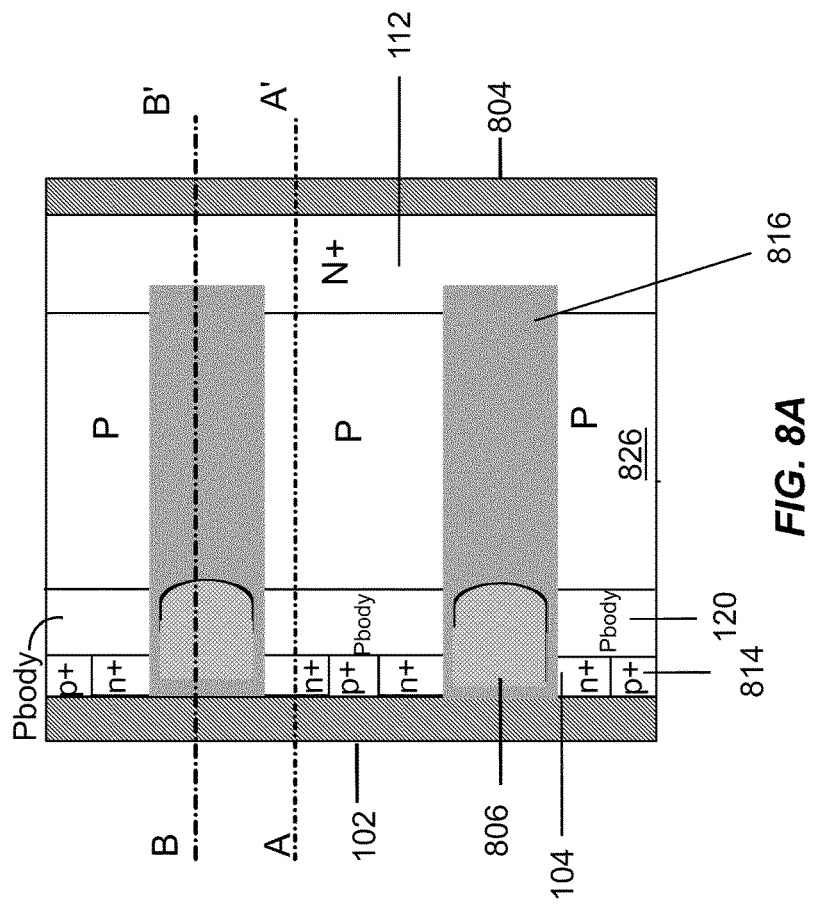
FIG. 8(a) is a structural diagram depicting a semiconductor-on-insulator device in accordance with an embodiment.

FIG. 8A shows a different embodiment, with a different kind of lateral trench isolation. In this embodiment the gate electrode 806 is also laterally confined within the trench 816. Capacitive coupling between the gate electrode and the body is lateral, through the sidewalls of the active region (120 and 826). Because of this, the geometry of the body contact diffusion 814 is necessarily slightly different from that of body contact diffusion 118.

Cross-sectional views along lines AA' and BB' are shown in FIGS. 8B and 8C respectively. Note that the gate electrode is not visible in FIG. 8B: this is because the gate electrode couples to the channel from outside the plane of the drawing. (That is, the orientation of the channel, with respect to the source/drain axis, is orthogonal to that of FIG. 1A, and also orthogonal to that of FIG. 4A.)

In FIG. 8C, the trench 816 reaches the buried insulator layer 124, but this is not strictly necessary. Conduction in the on-state can be both along the trench walls and also along the top surface of the drift region, if permanent charge 116 with a positive polarity is disposed within the insulating layer 114 as shown in FIG. 8B. The permanent charge induces an inversion layer, and the insulating layer 816 extends to the gate region 806 in order for conduction to occur. Alternatively or additionally, conduction can occur along the trench edge if permanent charge with a positive polarity is disposed along the trench insulator semiconductor interface. This enables an inversion layer to be formed along the trench sidewall connecting the drain region 112 to the channel.

In FIG. 8C, it can also be seen that the body contact diffusion 814 extends beneath the source/body contact metallization 102.

Note that, in the embodiments of FIGS. 7A-8C, the lateral isolation of the drift regions combines synergistically with the SOI structure, since the drift region is thereby enclosed in nearly full dielectric isolation. This is particularly advantageous in embodiments where the buried dielectric layer 124 is continuous.

According to various disclosed embodiments, there is provided: A lateral semiconductor-on-insulator device comprising: a body region connected to a drain region by a semiconductor-on-insulator region; a dielectric overlying said semiconductor-on-insulator region between the body region and the drain region; and permanent charge, embedded in said dielectric, and having a density at least sufficient to cause depletion in the semiconductor-on-insulator region.

According to various disclosed embodiments, there is provided: A lateral semiconductor-on-insulator device comprising: a first-conductivity-type semiconductor body region, electrically connected to a drain region by a second-conductivity-type semiconductor drift region; a dielectric overlying said drift region between said body and drain regions; said drift region overlying a buried dielectric layer; a first-conductivity-type surface region in said drift region, in proximity to an interface between said dielectric and said drift region; and permanent charge, embedded in said dielectric with a density sufficient to cause depletion in the surface region.

According to various disclosed embodiments, there is provided: A lateral semiconductor-on-insulator device comprising: an n-type source region, separated from a drift region by a p-type body region; said drift region separating said body region from a drain region; a dielectric overlying said drift region; said drift region overlying a buried dielectric layer; and permanent charge, embedded at the interface between said dielectric and said drift region, and having a density at least sufficient to cause depletion in the semiconductor-on-insulator region.

According to various disclosed embodiments, there is provided: A lateral semiconductor-on-insulator device comprising: an n-type source region, separated from a drift region by a p-type body region; said drift region separating said body region from a drain region; a dielectric overlying said drift region; said drift region overlying a buried dielectric layer; permanent charge, embedded at the interface between said dielectric and said drift region, and having a density at least sufficient to cause inversion of said drift region; and additional permanent charge, embedded at the interface between said buried dielectric and said drift region, and having a density at least sufficient to cause depletion of at least part of said drift region.

According to various disclosed embodiments, there is provided: A lateral semiconductor device comprising: a carrier source; a semiconductor body region interposed between said source and a semiconductor drift region; said drift region being interposed between said body region and a drain region, and also being at least partially surrounded by semiconductor/dielectric interfaces; and permanent charge, at said semiconductor/dielectric interfaces, having a polarity which balances charge in nearby portions of said drift region when said drift region is depleted.

According to various disclosed embodiments, there is provided: A lateral semiconductor device comprising: a carrier source; a semiconductor body region interposed between said source and a semiconductor drift region; said drift region being interposed between said body region and a drain region, and also being laterally abutted by isolation trenches; and permanent charge, at a face of said isolation trench, having a polarity which balances charge in nearby portions of said drift region when said drift region is depleted.

According to various disclosed embodiments, there is provided: A method of operating a lateral semiconductor-on-insulator device comprising: in the off state, blocking conduction from a source region through a body region and a drift region to a drain region, by turning off a channel portion of said body region, and allowing applied voltage to deplete at least part of said drift region; wherein the charge of ionized dopant atoms in depleted portion of said drift region is at least partly balanced by one or more of permanent charge at an interface between said drift region and an overlying dielectric, permanent charge at an interface between said drift region and an underlying buried dielectric, and permanent charge at an interface between said drift region and one or more isolation trenches which laterally border said drift region; and in the ON state, enabling conduction by turning on said channel portion.

According to various disclosed embodiments, there is provided: A lateral SOI device may include a semiconductor channel region connected to a drain region by a drift region. An insulation region on the drift layer is positioned between the channel region and the drain region. Permanent charges may be embedded in the insulation region sufficient to cause inversion in the insulation region. The semiconductor layer also overlies a global insulation layer, and permanent charges are preferably embedded in at least selected areas of this insulation layer too.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

The specific electrical characteristics of devices fabricated using the methods described in this disclosure depends on a number of factors including the thickness of the layers, their doping levels, the materials being used, the geometry of the layout, etc. One of ordinary skill in the art will realize that simulation, experimentation or a combination thereof can be used to determine the design parameters needed to operate as intended.

The doping levels needed to achieve high breakdown and low-resistance are governed by the well-known charge balance condition.

While the figures shown in this disclosure are qualitatively correct, the geometries used in practice may differ and should not be construed as a limitation in any way. It is understood by those of ordinary skill in the art that the actual cell layout will vary depending on the specifics of the implementation and any depictions illustrated herein should not be considered a limitation in any way.

While only n-channel MOSFETs are shown here, p-channel MOSFETs are also realizable with the disclosed inventions, simply by changing the polarity of the permanent charge and swapping n-type and p-type regions in any of the figures.

While only MOSFETs are shown, many other device structures are implementable using the disclosed inventions, including diodes, IGBTs, thyristors, JFETs, BJTs, and the like.

It should be noted in the above drawings that the positive and negative permanent charge were drawn inside the dielectric for illustration purpose only. It should be understood that the charge can be in the dielectric (oxide) at the interface between semiconductor and oxide, inside the semiconductor layer or a combination of all these cases.

For another example, other source structures can optionally be used, in addition to the numerous embodiments of source structure shown and described above.

For another example, other drain structures can optionally be used, in addition to the various embodiments shown and described above.

Preferably the active device is fabricated in monocrystalline semiconductor material. However, in alternative and less preferable embodiments the semiconductor material can have a high defect density and/or can be polycrystalline.

In various alternative embodiments, the interface charge characteristics of the interface to the buried dielectric layer can be manipulated to provide additional depletion or inversion effects along the lines describe above. Thus, even in embodiments where additional permanent charge is not present on the back interface, the interface charge of this interface may cooperate synergistically with permanent charge at top and/or lateral interfaces.

The following applications may contain additional information and alternative modifications: Ser. No. 61/125,892 filed Apr. 29, 2008; Ser. No. 61/058,069 filed Jun. 2, 2008 and entitled "Edge Termination for Devices Containing Permanent Charge"; Ser. No. 61/060,488 filed Jun. 11, 2008 and entitled "MOSFET Switch"; Ser. No. 61/074,162 filed Jun. 20, 2008 and entitled "MOSFET Switch"; Ser. No. 61/076,767 filed Jun. 30, 2008 and entitled "Trench-Gate Power Device"; Ser. No. 61/080,702 filed Jul. 15, 2008 and entitled "A MOSFET Switch"; Ser. No. 61/084,639 filed Jul. 30, 2008 and entitled "Lateral Devices Containing Permanent Charge"; Ser. No. 61/065,759 filed Feb. 14, 2009 and entitled "Highly Reliable Power MOSFET with Recessed Field Plate and Local Doping Enhanced Zone"; Ser. No. 61/027,699 filed Feb. 11, 2008 and entitled "Use of Permanent Charge in Trench Sidewalls to Fabricate Un-Gated Current Sources, Gate Current Sources, and Schottky Diodes"; Ser. No. 61/028,790 filed Feb. 14, 2008 and entitled "Trench MOSFET Structure and Fabrication Technique that Uses Implantation Through the Trench Sidewall to Form the Active Body Region and the Source Region"; Ser. No. 61/028,783 filed Feb. 14, 2008 and entitled "Techniques for Introducing and Adjusting the Dopant Distribution in a Trench MOSFET to Obtain Improved Device Characteristics"; Ser. No. 61/091,442 filed Aug. 25, 2008 and entitled "Devices Containing Permanent Charge"; Ser. No. 61/118,664 filed Dec. 1, 2008 and entitled "An Improved Power MOSFET and Its Edge Termination"; and Ser. No. 61/122,794 filed Dec. 16, 2008 and entitled "A Power MOSFET Transistor".

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A lateral semiconductor-on-insulator device comprising:
    a body region connected to a drain region by a semiconductor-on-insulator region;
    a gate electrode which is capacitively coupled to said body region;
    a dielectric overlying said semiconductor-on-insulator region between the body region and the drain region; and
    permanent charge, embedded in said dielectric, and having a density at least sufficient to cause depletion in the semiconductor-on-insulator region;
    wherein said permanent charge comprises implanted ions; and
    wherein at least some of said permanent charge overlies regions which are not overlaid by the gate electrode.

2. The lateral semiconductor-on-insulator device of claim 1, further comprising
    an insulator region beneath the semiconductor-on-insulator region, and
    additional permanent charge embedded in the insulator region,
    wherein said additional permanent charge at least partly depletes the semiconductor-on-insulator region.

3. The lateral semiconductor-on-insulator device of claim 2, further comprising a trench gate.

4. The lateral semiconductor-on-insulator device of claim 2, wherein said insulator is continuous across the entire device.

5. The lateral semiconductor-on-insulator device of claim 1, further comprising a trench gate.

6. A lateral semiconductor-on-insulator device comprising:
    a body region connected to a drain region by a semiconductor-on-insulator region;
    a gate electrode which is capacitively coupled to the body region;
    a dielectric overlying said semiconductor-on-insulator region between the body region and the drain region; and
    permanent charge, embedded in said dielectric, and having a density at least sufficient to cause depletion in the semiconductor-on-insulator region;
    wherein said permanent charge has a density sufficient to cause inversion in said semiconductor-on-insulator region;
    wherein at least some of said permanent charge overlies regions which are not overlaid by the gate electrode; and
    wherein said permanent charge comprises implanted ions.

7. A lateral semiconductor-on-insulator device comprising:
    an n-type source region, separated from a drift region by a p-type body region;
    said drift region separating said body region from a drain region;
    a dielectric overlying said drift region;
    said drift region overlying a buried dielectric layer; and
    permanent charge, embedded at the interface between said dielectric and said drift region, and having a density at least sufficient to cause depletion in the drift region;
    wherein said permanent charge comprises implanted ions.

8. The lateral semiconductor-on-insulator device of claim 7, further comprising additional permanent charges embedded in said buried dielectric layer, and wherein said additional permanent charges at least partly deplete said drift region.

9. The lateral semiconductor-on-insulator device of claim 7, wherein said drift region is n-type.

10. The lateral semiconductor-on-insulator device of claim 7, wherein said drift region includes only a single conductivity type.

11. The lateral semiconductor-on-insulator device of claim 7, further comprising a trench gate which controls conduction through part of said body region.

12. The lateral semiconductor device of claim 7, further comprising a carrier source comprising a first-conductivity type source diffusion, and wherein said body is second-conductivity-type, and wherein the electrode lies within an isolation trench and is capacitively coupled to define a channel region which is interposed between said source diffusion and said drift region.

13. The semiconductor device of claim 7, wherein said drift region is overlain by a dielectric layer which also contains ones of said permanent charges.

14. The semiconductor device of claim 7, wherein said drift region is overlain by a dielectric layer which also contains ones of said permanent charges, and is also underlain by a buried dielectric layer which also contains ones of said permanent charges.

15. The semiconductor device of claim 7, further comprising a tapered isolation trench.

16. A lateral semiconductor-on-insulator device comprising:
- an n-type source region, separated from a drift region by a p-type body region;
- said drift region separating said body region from a drain region;
- a dielectric overlying said drift region;
- said drift region overlying a buried dielectric layer; and
- permanent charge, embedded at the interface between said dielectric and said drift region, and having a density at least sufficient to cause depletion in the drift region;
- wherein said permanent charge has a density sufficient to cause inversion in said drift region; and
- wherein said permanent charge comprises implanted ions.

17. The lateral semiconductor-on-insulator device of claim 16, further comprising:
- a gate electrode capacitively coupled to said body region;
- wherein said permanent charge has a polarity which balances charge in nearby portions of said drift region when said drift region is depleted; and
- wherein at least some of said permanent charge overlies regions which are not overlaid by the gate electrode.

18. The semiconductor device of claim 17, wherein the buried dielectric layer contains ones of said permanent charges, and the drift region is laterally confined by a dielectric trench which also contains ones of said permanent charges.

19. The lateral semiconductor device of claim 17, wherein the gate is capacitively coupled to define a channel region which is interposed between said source region and said drift region.

20. The semiconductor device of claim 17, wherein said drift region is laterally confined by a dielectric trench which also contains ones of said permanent charges.

* * * * *